(12) United States Patent
Imai et al.

(10) Patent No.: US 8,836,452 B2
(45) Date of Patent: Sep. 16, 2014

(54) TUNER MODULE AND RECEIVING DEVICE

(75) Inventors: Tadashi Imai, Chiba (JP); Makoto Watanabe, Tokyo (JP); Toshiyuki Sudo, Tokyo (JP); Toshiyuki Nagano, Kanagawa (JP); Mitsuru Ikeda, Tokyo (JP); Teruyuki Toyoda, Tokyo (JP); Hideaki Ozawa, Chiba (JP); Tomonori Nakajima, Tokyo (JP); Goujin Arakawa, Kanagawa (JP); Norio Uchida, Kanagawa (JP); Hiroyuki Takamatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 569 days.

(21) Appl. No.: 13/181,982

(22) Filed: Jul. 13, 2011

(65) Prior Publication Data

US 2012/0019731 A1    Jan. 26, 2012

(30) Foreign Application Priority Data

Jul. 22, 2010    (JP) .................................. 2010-165131

(51) Int. Cl.
*H03J 5/00* (2006.01)
*H04N 5/64* (2006.01)
*H04N 21/426* (2011.01)
*H04N 5/50* (2006.01)

(52) U.S. Cl.
CPC . *H04N 5/50* (2013.01); *H04N 5/64* (2013.01); *H04N 21/426* (2013.01); *H03J 5/00* (2013.01)
USPC .......................................................... 334/85

(58) Field of Classification Search
CPC .................. H03J 1/00; H03J 5/00; H03J 3/00
USPC .................................................. 334/85; 333/33
See application file for complete search history.

(56) References Cited

U.S. PATENT DOCUMENTS

2005/0162242 A1*    7/2005    Ootori et al. .................... 334/85

FOREIGN PATENT DOCUMENTS

| JP | 3411461 | 3/2003 |
| JP | 2004-229212 A | 8/2004 |

* cited by examiner

*Primary Examiner* — Benny Lee
*Assistant Examiner* — Gerald Stevens
(74) *Attorney, Agent, or Firm* — Sony Corporation

(57) ABSTRACT

A tuner module includes a tuner module substrate having a tuner function part formed thereon, a case body having a shielding function of holding and incorporating at least the tuner module substrate, a circuit board on which the tuner module substrate is mounted, and at least one antenna connector to be fixed to the case body and having a core wire connected to the tuner module substrate incorporated in the case body. A part of the circuit board is contained inside the case body.

12 Claims, 5 Drawing Sheets

10A

TUNER MODULE AND RECEIVING DEVICE

BACKGROUND

The present disclosure relates to a tuner module and receiving device applicable to a television tuner or the like.

In recent years, a television (TV) tuner, which is an example of a high-frequency module, is incorporated not only in a TV receiver but also an IT device, such as a personal computer (PC).

These TV and PC have become small-sized and thinner year by year to enhance convenience. Also in a tuner module, a reduction in thickness has been an important issue.

Examples of the shape of a TV tuner and its implementing method are disclosed in Japanese Patent No. 3411461, which is herein referred to as a first example, and Japanese Unexamined Patent Application Publication No. 2004-229212, which is herein referred to as a second example.

In the first example, the outer shape of a contact surface of a chassis on which an input connector (an antenna connector) is to be mounted is configured to be thicker than a chassis angle part.

This shape is optimized for the purpose of making a casing of a single tuner body thinner, and the structure is such that the thickness is determined by the outer diameter of the input connecter.

The second example describes a structure in which a lower part of an input-connector mounting position abuts on a circuit board where a tuner is mounted and another leg part simultaneously abutting on the circuit board at a similar height is combined for mounting.

Also with this method, the thickness of the tuner is determined to be approximately equal to the outer diameter of the input connector.

SUMMARY

However, in the first example, the structure is such that the mounting part of the input connector and the chassis angle part are covered and fixed with a common cover simultaneously from upper and lower surfaces.

In this case, when the surface of the cover forming a uniform surface is taken as a reference, even if a circumscribing part of the input connector and the thickness of the chassis angle part are significantly increased, the thickness has to be at a height approximately equal to the dimension of the circumscribing part of the input connector after the cover is placed on these parts.

Therefore, the structure is such that the thickness of the whole tuner can be decreased to be somewhat thinner than the outer diameter of the input connector or the thickness is hardly decreased because the cover is put on.

Moreover, also in the second example, the structure is such that the tuner is placed on the board where the tuner is mounted, and therefore the thickness of the tuner part includes the thickness of the circuit board. That is, the structure is such that a thickness approximately equal to the outer diameter of the input connector is added to the thickness of the circuit board.

Similarly in this example, the tuner as a whole has a thickness approximately equal to the outer diameter of the input connector, and the tuner is placed on the circuit board with the shape being the same. Therefore, the resultant structure has a thickness added with the thickness of the circuit board, thereby restricting a reduction in thickness.

As described above, in the tuner structure using the related art, the tuner is mounted on the circuit board. Therefore, the thickness dimension of the tuner is simply added to the thickness of the circuit board.

Therefore, in order to decrease the thickness dimension of the tuner part, the thickness of the input connector to be fixed to the tuner part forms a lower limit, which can be easily found also from the above-cited two documents.

In liquid-crystal TVs whose thickness has been reduced particularly in recent years, the height of the tuner becomes non-negligible.

In the structure in which the tuner is mounted on the board, it can be easily expected that the center of the input connector part to which an input cable from an antenna is connected is located at a position that is offset from the midpoint of the thickness obtained by combining the thickness of the circuit board and the thickness of the tuner.

In this case, an inconvenience tends to occur such that a working space is narrow even when a cable is actually connected to the TV.

It is desired to provide a tuner module and a receiving device in which, the whole thickness dimension when the tuner module substrate is mounted on the circuit board can be suppressed to be equal to the thickness dimension of the tuner module and therefore the whole thickness dimension can be extremely reduced at low cost.

A tuner module according to an embodiment of the present disclosure includes a tuner module substrate having a tuner function part formed thereon, a case body having a shielding function of holding and incorporating at least the tuner module substrate, a circuit board on which the tuner module substrate is mounted, and at least one antenna connector to be fixed to the case body and having a core wire connected to the tuner module substrate incorporated in the case body, and a part of the circuit board is contained inside the case body.

A receiving device according to another embodiment of the present disclosure includes a reception antenna receiving a broadcast wave signal, a tuner module including a function of frequency-converting the broadcast wave signal input through the reception antenna, and a demodulating unit demodulating the frequency-converted reception signal. The tuner module includes a tuner module substrate having a tuner function part formed thereon, a case body having a shielding function of holding and incorporating at least the tuner module substrate, a circuit board on which the tuner module substrate is mounted, and an antenna connector fixed to the case body, connected to the reception antenna, and having a core wire connected to the tuner module substrate incorporated in the case body, and a part of the circuit board is contained inside the case body.

According to the embodiments of the present disclosure, the whole thickness dimension when the tuner module substrate is mounted on the circuit board can be suppressed to be equal to the thickness dimension of the tuner module, and therefore the whole thickness dimension can be extremely reduced at low cost.

DETAILED DESCRIPTION OF EMBODIMENTS

Embodiments of the present disclosure are described below in association with the drawings.

Note that the description is made in the order below.

1. First Embodiment (First Example of Structure of the Tuner Module)
2. Second Embodiment (Second Example of Structure of the Tuner Module)
3. Third Embodiment (Third Example of Structure of the Tuner Module)
4. Fourth Embodiment (Example of Structure of the Receiving Device)

1. First Embodiment

Figure 1:
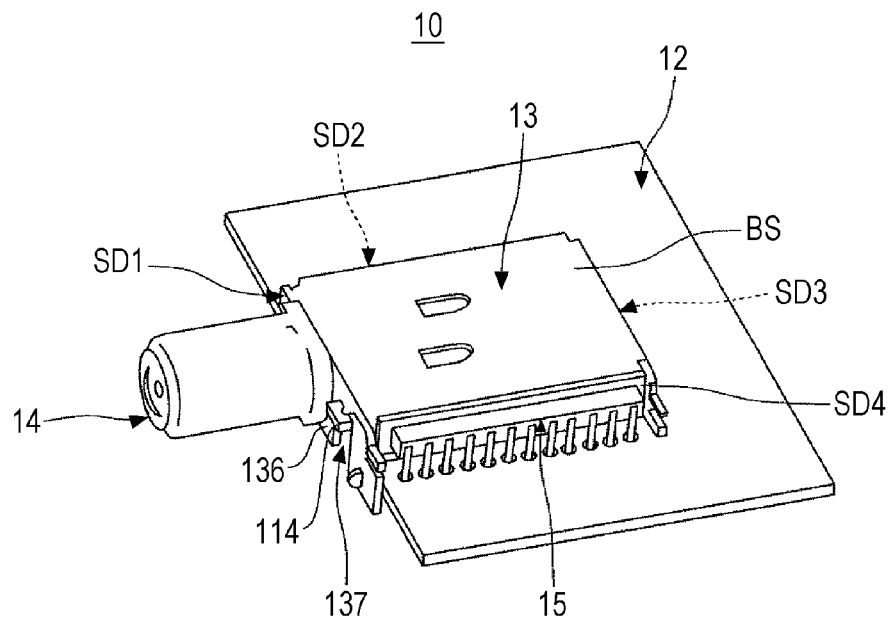
FIG. 1 is a perspective view of an example of structure of a tuner module according to a first embodiment of the present disclosure viewed from an upper surface side.

FIG. 1 is a perspective view of an example of structure of a tuner module according to a first embodiment of the present disclosure viewed from an upper surface side.

Figure 2:
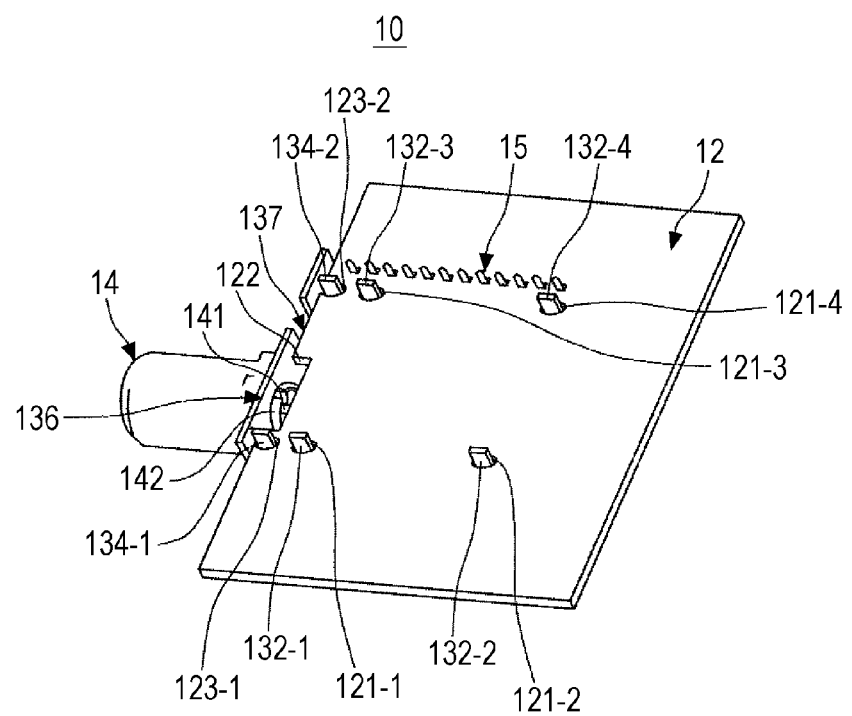
FIG. 2 is a perspective view of the example of structure of the tuner module according to the first embodiment of the present disclosure viewed from a bottom surface side.

FIG. 2 is a perspective view of the example of structure of the tuner module according to the first embodiment of the present disclosure viewed from a bottom surface side.

Figure 3:
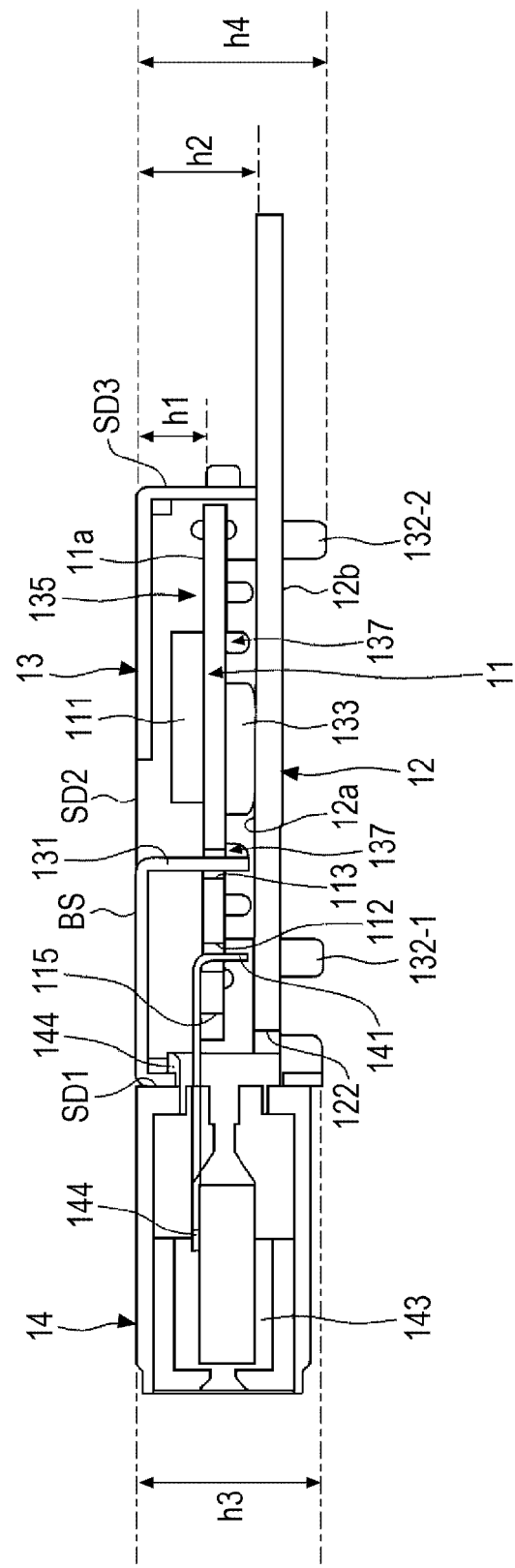
FIG. 3 is a schematic sectional view of the example of structure of the tuner module according to the first embodiment of the present disclosure.

FIG. 3 is a schematic sectional view of the example of structure of the tuner module according to the first embodiment of the present disclosure.

A tuner module 10 according to the first embodiment has a tuner module substrate 11 having a tuner function part formed therein and a circuit board 12 as a main substrate on which the tuner module substrate 11 is mounted.

The tuner module 10 has a case body 13 holding and incorporating the tuner module substrate 11 and having a function as a shielding case.

The tuner module 10 has at least one antenna connector 14 fixed to the case body 13 and having a core wire 141 to be connected to the tuner module substrate 11 incorporated in the case body 13.

The tuner module substrate 11 has a main surface 11a on which a circuit (IC) 111, for example, as a television (TV) tuner module function unit, is formed (mounted).

This tuner module substrate 11 is mounted on the circuit board 12.

The tuner module substrate 11 is formed in a rectangular shape having a size that can be accommodated in an accommodation space 135 of the case body 13.

In the tuner module substrate 11, a through hole 112 is formed in which a core wire 141 of the antenna connector 14 is inserted.

In the tuner module substrate 11, a through hole 113 is formed in which a raised part 131 obtained by raising a part of a base surface part BS of the case body 13 inward is inserted.

As described above, the tuner module substrate 11 has a rectangular shape, with a part of its surrounding edge formed with one or plurality of engaged parts 114.

This engaged part 114 is engaged with an engaging part 137 formed on a case body 13 side, which will be described further below, with the tuner module substrate 11 being accommodated in the accommodation space 135 of the case body 13, thereby causing the case body 13 to hold the tuner module substrate 11 at a stable position in the accommodation space.

Furthermore, to prevent a crimped part fitting the outer perimeter part of the antenna connector 14 and the case body 13 together from interfering with the tuner module substrate 11, the tuner module substrate 11 has a notched part 115 formed at an end of the tuner module substrate 11.

With the notched part 115 provided to the tuner module substrate 11, more stable positioning can be made.

The circuit board 12 is a substrate larger than the tuner module substrate 11, and has formed therein insertion openings 121-1 to 121-4 in which inserters 132-1 to 132-4, respectively, formed in the case body 13 are inserted.

With the inserters 132-1 to 132-4 being inserted in the insertion openings 121-1 to 121-4, the circuit board 12 is supported by a supporting part 133 formed on the case body 13 in the accommodation space 135 of the case body 13, and partly contained in the case body 13.

The circuit board 12 has pin connectors 15 connected for signals and power supply formed in the case body 13.

Furthermore, as with the tuner module substrate 11, to prevent the crimped part fitting the outer perimeter part of the antenna connector 14 and the case body 13 together from interfering with the circuit board 12, the circuit board 12 has a notched part 122 formed at an end of the circuit board 12.

With the notched part 122 provided to the circuit board 12, more stable positioning can be made.

On both sides of this notched part 122, slit parts 123-1 and 123-2 are formed, in which engaging pieces 134-1 and 134-2 formed on the case body 13 are inserted.

The case body 13 is formed like a frame in the shape of a rectangular parallelepiped with one surface side (a bottom surface side) opening.

The case body 13 has at least one antenna connector 14 fixed thereto with crimped fitting.

As will be described further below, the case body 13 is formed to have a thickness equivalent to the outer diameter of the antenna connector 14. In this case, the antenna connector 14 is formed so that its outer appearance is flat.

The case body 13 accommodates the tuner module substrate 11 in its accommodation space 135 so as to cover the tuner module substrate 11, and is fixed by soldering or the like to the circuit board 12 with the inserters 132-1 to 132-4.

For the case body 13 functioning as a shielding case of the present embodiment, a thin metal material with excellent solderability is used, such as so-called albata, which is an alloy of copper, nickel, and zinc.

However, in general, the case body 13 can be made of any material as long as conductivity is excellent. Therefore, if restrictions on the shape are loose, an inexpensive tin material or its similar material can be used.

The case body 13 is formed in an approximately frame shape having the rectangular base surface part BS serving as an upper surface in a fixed state and side parts SD1, SD2, SD3, and SD4 formed at edges of the base surface part BS.

At an approximately center portion of the base surface part BS, the raised part 131 obtained by raising a part of the base surface part BS inward is formed.

In this example, as depicted in FIG. 1, the raised part 131 is formed at two positions. The raised part 131 is inserted in (penetrates through) the through hole 113 formed in the tuner module substrate 11, and is fixed by soldering or the like as being connected to a substrate ground.

On the side part SD1, a connector fixing part 136 is formed to which the antenna connector 14 is fixed so that the core wire 141 faces inside the case body 13.

To the connector fixing part 136 of the case body 13, the antenna connector 14 is fixed by crimped fitting.

Also, on the side parts SD1 and SD2 or further the side part SD3, an engaging part 137 with which the engaged part 114 of the turner module substrate 11 is engaged is formed. On the side part SD1, the engaging part 137 is formed in parallel to the connector fixing part 136.

The engaging part 137 is formed on a plurality of side parts so as to be stably held in the accommodation space 135 of the case body 13.

The engaging part 137 has a function of supporting the engaged part 114 at a predetermined height. For example, the engaging part 137 may be configured to have an inserter formed thereon to guide an insertion opening formed in the engaged part 114 for connection to the substrate ground.

By adopting this configuration, the tuner module substrate 11 can be more stably held and fixed.

Furthermore, on the side parts SD2 and SD3, the supporting part 133 is formed, which abuts on and supports a non-conductive part of a substrate surface 12a of the circuit board 12 partially accommodated in the accommodation space 135.

In the present embodiment, the height of the side part SD3 facing the side part SD1 is set so that the side part SD3 itself functions as the supporting part 133.

Also, the inserters 132-1 and 132-2 are formed on both ends of the side part SD2, and the inserters 132-3 and 132-4 are formed on both ends of the side part SD4 facing the side part SD2.

Furthermore, pin connectors 15 are disposed on the side part SD4.

Here, the heights of the engaging part 137, the supporting part 133, and the connector fixing part 136 with reference to the base surface part BS are described. Here, although a reference surface may be any of an outer surface and an inner surface of the base surface part BS, the outer surface is taken as a reference in the description below.

The engaging part 137 is formed to have a first height h1 from the base surface part BS, and the engaged part 114 of the tuner module substrate 11 is engaged with the engaging part 137.

The engaging part 137 has a function of stably holding and fixing the tuner module substrate 11 in the accommodation space 135 with the first height h1 from the base surface part BS.

The supporting part 133 is formed to have a second height h2 higher than the first height h1 from the base surface part BS, with a part of the circuit board 12 abutting on the non-conductive part for supporting.

As described above, the side part SD3 facing the side part SD1 including the connector fixing part 136 is formed to have the second height h2 higher than the first height h1 from the base surface part BS, as the side wall, so that the side part SD3 itself functions as the supporting part 133.

With this, the part of the circuit board 12 is held in the accommodation space 135 with a predetermined space (h2-h1) from the tuner module substrate 11.

The connector fixing part 136 is formed to have a third height h3 higher than the second height h2 from the base surface part BS, and the antenna connector 14 is fixed so that the core wire 141 faces inside the case body 13.

The antenna connector 14 has its outer diameter having a height equivalent to the third height h3 of the connector fixing part 136. With this third height h3, the thickness of the tuner module 10 is defined.

To prevent the crimped part fitting the outer perimeter part of the antenna connector 14 and the case body 13 together from interfering with the tuner module substrate 11, an edge of the tuner module substrate 11 facing the connector fixing part 136 has the notched part 115 formed at an end of the tuner module substrate 11.

Similarly, to prevent the crimped part fitting the outer perimeter part of the antenna connector 14 and the case body 13 together from interfering with the circuit board 12, an edge of the circuit board 12 facing the connector fixing part 136 has the notched part 122 formed at an end of the circuit board 12.

In the tuner module 10, the engaged part 114 of the tuner module substrate 11 is engaged with the engaging part 137.

With the circuit board 12 being supported by the supporting part 133, the tuner module substrate 11 and a part of the circuit board 12 are contained in the accommodation space 135 of the case body 13 within a height shorter than the outer diameter of the antenna connector 14.

Note that the inserters 132-1 to 132-4 each have a height from the base surface part BS set at the third height h3 or a fourth height h4 higher than the third height h3. Alternatively, the fourth height h4 can be set at a height lower than the third height h3.

The inserters 132-1 to 132-4 can be any as long as they can be functionally inserted in and fixed to the insertion openings 121-1 to 121-4 of the circuit board 12, and the height of these inserters is not particularly restrictive.

The antenna connector 14 is fixed to the connector fixing part 136 of the case body 13 so that the core wire 141 faces inside the case body 13.

The antenna connector 14 of the present embodiment is fixed by crimped fitting as described above with respect to the connector fixing part 136 of the case body 13.

The antenna connector 14 has a crimped part 142 folded inside the case body 13. By lifting up this crimped part 142, the metal plate forming the case body 13 is fixed as being interposed between the crimped part 142 and a portion of the antenna connector 14 outside the case body 13.

This technique is referred to as crimping, and is used similarly in other embodiments.

More specifically, the antenna connector 14 has a structure of fixing a dielectric 143 filled with a shell to support its inner center conductor 144. The above-structured antenna connector 14 has its outer perimeter part subjected to crimping, thereby being jointed to the connector fixing part 136 of the case body 13.

The core wire 141 of the antenna connector 14 is electrically connected to the tuner module substrate 11 by a pattern of a signal input terminal with the through hole 112 positionally defined with respect to the tuner module substrate 11.

Also, in the tuner module 10, the antenna connector 14 can be configured to be fixed to the base surface part BS.

In this case, the core wire 141 of the antenna connector 14 has its linear length aligned with the base surface BS.

As described above, the tuner module 10 of the present embodiment has the tuner module substrate 11 formed with a tuner function part, the circuit board 12 on which the tuner module substrate 11 is mounted, the case body 13, and the antenna connector 14.

With a part of the circuit board 12 being contained in the case body 13 of the tuner module 10, the tuner mounting part is configured to have a thickness equal to the thickness of the tuner module 10.

As described above, the tuner module 10 has a structure of fixing the dielectric 143 of the antenna connector 14 filled with a shell to support its inner center conductor 144. Also, with the antenna connector 14 having its outer perimeter part subjected to crimping, the antenna connector 14 is jointed to the case body 13 of the tuner module.

Furthermore, on the tuner module substrate 11 accommodated inside the case body 13, an electronic component typified by an IC 111 is mounted.

The tuner module substrate 11 is solder-jointed via the through hole 113 with the case body 13 as a ground potential, and also jointed with the core wire 141 connected to the center conductor 144 of the connector via the through hole 112 in the tuner module substrate 11. With this, a high-frequency signal is introduced.

The case body 13 has the inserters 132-1 to 132-4 inserted in the insertion openings 121-1 to 121-4 of the circuit board 12 on which the tuner is mounted, thereby being fixed to the circuit board 12.

In this structure, the structural arrangement is such that an end of the connector fixing part 136 as a lowermost part of the case body 13 is lower than the bottom surface 12b of the circuit board 12 when mounted on the circuit board 12, and the case body 13 of the tuner module 10 contains a part of the circuit board 12.

Here, the case body 13 does not have the cover in the tuner described in Japanese Patent No. 3411461, and is configured to be thinner by the thickness of the cover eliminated.

As a result, since it is difficult to cut out and raise a part of the case body 13 to provide a barrier wall inside, the raised part 131 having a width on the order of 1 mm is formed so that the size of a hole occurring in an upper surface of the case body 13 by folding is decreased as much as possible.

The inserters 132-1 to 132-4 for jointing the circuit board 12 and the tuner together are each set to have a width on the order of 2 mm, and each form a hitch in combination with the circuit board 12, the hitch to a degree of not being moved by the weight of the input connector when the tuner is mounted. In parallel with this, consideration is given so that it is prevented to increase heat capacity when the case body 13 is fixed to the circuit board 12 by soldering to cause an insufficient increase in soldering temperature.

In this example, the shapes of the core wires 141 of all antenna connectors 14 are formed in an L shape, but can be in a U shape with an arc. Alternatively, a method can be used in which a plurality of bended parts are formed to create a shape of a part of a polygon so as to shorten the length of the core wire.

Also, by making the length of the core wire shorter than a resonant wavelength, unwanted resonance can be avoided.

2. Second Embodiment

Figure 4:
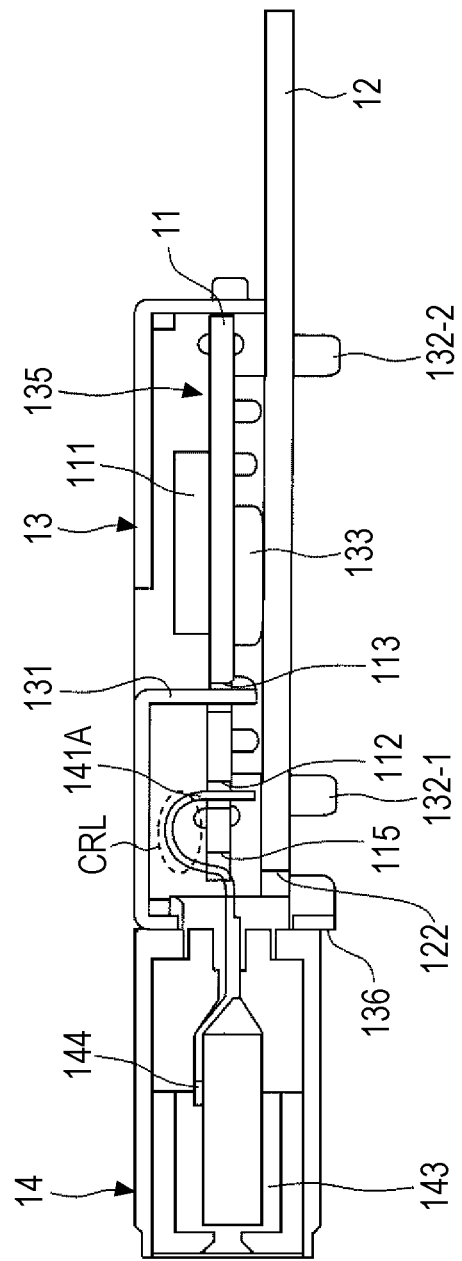
FIG. 4 is a schematic sectional view of an example of structure of a tuner module according to a second embodiment of the present disclosure.

FIG. 4 is a schematic sectional view of an example of structure of a tuner module according to a second embodiment of the present disclosure.

A tuner module 10A according to the second embodiment is different from the tuner module 10 according to the first embodiment in the following points.

In the tuner module 10 according to the first embodiment, the core wire 141 connected to the center conductor 144 of the antenna connector 14 is formed in an L shape.

By contrast, in the tuner module 10A according to the second embodiment, as indicated by a reference character CRL in the drawing, the shape of the core wire 141 of the antenna connector 14 is altered to a shape in which an arc is formed above a point of joint to the tuner module substrate 11.

With this arc shape, a position in a portion inside the outer perimeter part of the antenna connector 14 can be disposed at an approximately center position.

As a result, a gap from any position on concentric circles of the outer perimeter part of the antenna connector 14 to the center conductor 144 can have the same length. With this, a feature can be provided such that high-frequency electrical impedance is less prone to change with frequency.

Furthermore, the arc portion of the core wire 141 connected to the center conductor 144 has a spring characteristic. Therefore, even if mechanical stress occurs when the core wire 141 of the antenna cable makes contact with the center conductor 144, the junction with the antenna's core wire can be flexibly kept.

Therefore, a load on soldering joint at the joint point with the tuner module substrate 11 can be reduced.

3. Third Embodiment

Figure 5:
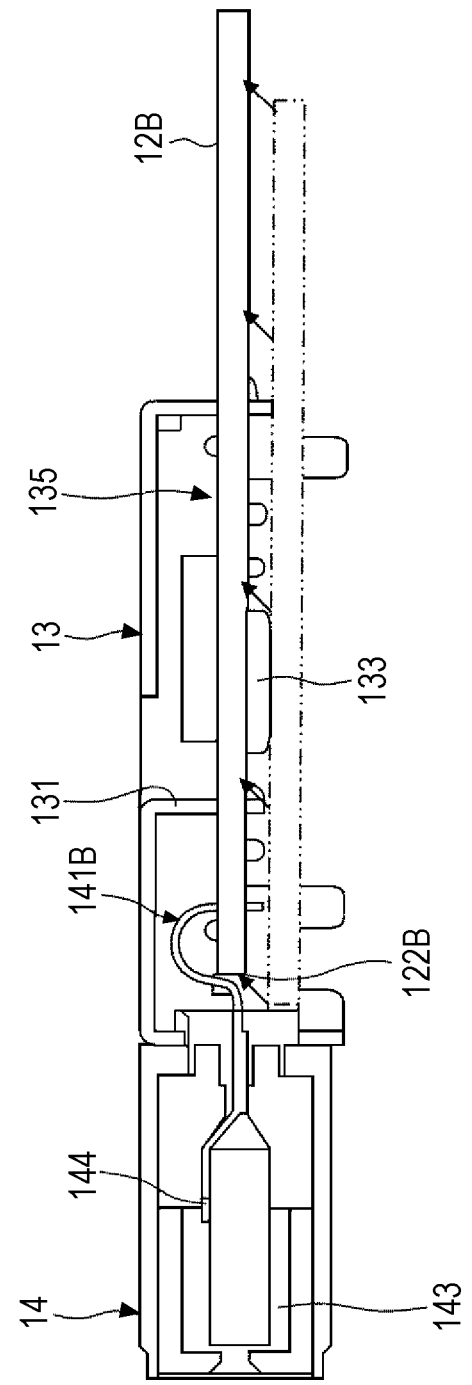
FIG. 5 is a schematic sectional view of an example of structure of a tuner module according to a third embodiment of the present disclosure.

FIG. 5 is a schematic sectional view of an example of structure of a tuner module according to a third embodiment of the present disclosure.

A tuner module 10B according to the third embodiment is different from the tuner module 10A according to the second embodiment in the following points.

In the tuner module 10B according to the third embodiment, a circuit board 12B has a function of a tuner module substrate, and is disposed at an engaging position for a tuner module substrate.

That is, the tuner module 10B can be configured in a manner such that the disposing position of the circuit board 12B is set at a position of engagement with the engaging part 137 and therefore the antenna connector 14 is disposed approximately on an extension of the circuit board 12.

Also in this case, with the arc portion of the core wire 141 to be connected to the center conductor 144 for use in the second embodiment, disposition can be made without interference with the circuit board 12.

With this, a wide range of variations can be provided to designing of, for example, an inner mechanism of a TV having the circuit board 12 mounted thereon.

In this example, since a circuit element 111 of the tuner is directly mounted on the circuit board 12, the tuner may be called an on-board tuner.

As described above, according to the tuner module of the present embodiment, effects can be obtained as described below.

That is, according to the tuner module of the present embodiment, the whole thickness dimension when the tuner module substrate is mounted on the circuit board 12 can be suppressed to be equal to the thickness dimension of the tuner module. Therefore, for example, the shape of a TV set on which the tuner module is mounted can also be made thinner.

Furthermore, as in the third embodiment, with the circuit board 12B having a function of a tuner module substrate and being disposed at the engaging position for the tuner module substrate, the center of the antenna connector 14 can be disposed on an approximately same line as the component-mounted surface of the circuit board.

For this reason, for example, the degree of flexibility in disposing an input connector exposed from a TV set to outside in a vertical direction is widened. Therefore, an operation of actually connecting an antenna cable can be facilitated.

The tuner module having the structure as described above can be applied to a receiving device, such as a TV receiver.

4. Fourth Embodiment

Figure 6:
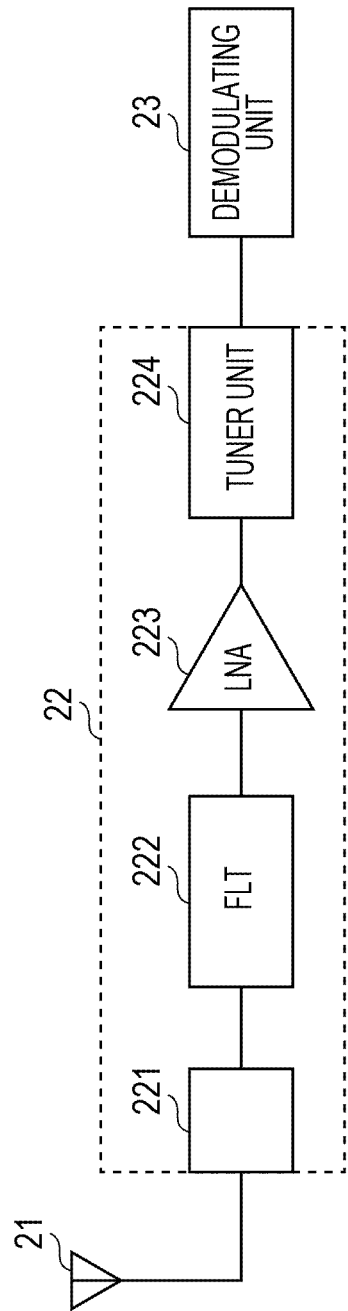
FIG. 6 is a view of an example of structure of a receiving device in which the tuner module of the embodiments of the present disclosure is adopted.

FIG. 6 is a view of an example of structure of a receiving device in which the tuner module of the embodiments of the present disclosure is adopted.

This receiving device 20 is configured to receive, for example, a terrestrial broadcast wave signal or a satellite broadcast wave signal.

As depicted in FIG. 6, the receiving device 20 has a reception antenna 21 receiving a broadcast wave signal, a tuner module 22 including a frequency converting function, and a demodulating unit 23.

The tuner module 10, 10A, or 10B according to the first to third embodiments described above can be adopted as the tuner module 22.

The tuner module 22 has an antenna connector 221 corresponding to the antenna connector 14 of the tuner modules 10, 10A, and 10B, a filter (FLT) 222, a low noise amplifier (LNA) 223, and a tuner unit 224.

As the filter 222, according to the broadcast wave to be received, a high-pass filter (HPF), a band-pass filter (BPF), or a low-pass filter (LPF) is applied as appropriate.

The LNA 223 amplifies the broadcast wave signal received via the filter 222 for supply to the tuner unit 224.

When the reception signal is a satellite broadcast wave signal, the tuner unit 224 frequency-converts the reception signal to a base band signal. When the reception signal is a digital terrestrial broadcast wave signal, the tuner unit 224 frequency-converts the reception signal to an intermediate frequency signal. The tuner unit 224 then outputs the frequency-converted signal to the demodulating unit 23.

When the reception signal is a satellite broadcast wave signal, the demodulating unit 23 demodulates a video signal and an audio signal of the base band signal, and generates a transport stream.

When the reception signal is a digital terrestrial broadcast wave signal, the demodulating unit 23 demodulates a video signal and an audio signal of the intermediate frequency signal, and generates a transport stream.

When the reception signal is an analog terrestrial broadcast wave signal, the demodulating unit 23 demodulates a video signal and an audio signal of the intermediate frequency signal, and generates an analog video signal and an analog audio signal.

In the receiving device, any of the tuner modules 10, 10A, and 10B according to the first to third embodiments is adopted. Therefore, the whole thickness dimension when the tuner module substrate is mounted on the circuit board 12 can be suppressed to be equal to the thickness dimension of the tuner module. Therefore, for example, the shape of a TV set on which the tuner module is mounted can also be made thinner.

Furthermore, with the circuit board 12B having a function of a tuner module substrate and being disposed at the engaging position for the tuner module substrate, the center of the antenna connector 14 can be disposed on an approximately same line as the component-mounted surface of the circuit board.

For this reason, for example, the degree of flexibility in disposing an input connector exposed from a TV set to outside in a vertical direction is widened. Therefore, an operation of actually connecting an antenna cable can be facilitated.

The present disclosure contains subject matter related to that disclosed in Japanese Priority Patent Application JP 2010-165131 filed in the Japan Patent Office on Jul. 22, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A tuner module comprising:
   a tuner module substrate having a tuner function part formed thereon;
   a case body having a shielding function of holding and incorporating at least the tuner module substrate;
   a circuit board on which the tuner module substrate is mounted; and
   at least one antenna connector fixed to the case body and having a core wire connected to the tuner module substrate incorporated in the case body, wherein
   at least a portion of the circuit board is contained inside the case body, wherein the tuner module substrate has an edge at which an engaged part engaged with the case body is formed,
   the case body is formed in a frame having a base surface part, and
   a side part is formed at an edge part of the base surface part, wherein the side part includes
      an engaging part formed to have a first height from the base surface part, the engaging part in which the engaged part of the tuner module substrate is engaged, and
      a supporting part formed to have a second height greater than the first height from the base surface part and supporting the portion of the circuit board.

2. The tuner module according to claim 1, wherein the case body includes a connector fixing part formed to have a third height greater than the second height from the base surface part and to which the antenna connector is fixed so that the core wire faces inside the case body.

3. The tuner module according to claim 2, wherein
   the antenna connector has an outer diameter having a height equal to the third height of the connector fixing part, and
   with the engaged part of the tuner module substrate being engaged in the engaging part and the circuit board being supported by the supporting part, the tuner module substrate and the part of the circuit board are contained inside the case body within a height shorter than the outer diameter of the antenna connector.

4. The tuner module according to claim 2, wherein at least one of the tuner module substrate and the circuit board facing the connector fixing part is notched so as to avoid the connector fixing part of the antenna connector.

5. The tuner module according to claim 1, wherein the core wire of the antenna connector has an arc shape avoiding interference with the tuner module substrate to which the core wire is connected.

6. The tuner module according to claim 1, wherein the circuit board has a function of the tuner module substrate, and is disposed at an engaging position for the tuner module substrate.

7. A receiving device comprising:
   a reception antenna configured to receive a broadcast wave signal;
   a tuner module configured to frequency-convert the broadcast wave signal input through the reception antenna; and
   a demodulating unit configured to demodulate the frequency-converted reception signal; wherein
   the tuner module includes a tuner module substrate having a tuner function part formed thereon, a case body having a shielding function of holding and incorporating at least the tuner module substrate, a circuit board on which the tuner module substrate is mounted, and an antenna connector fixed to the case body, connected to the reception antenna, and having a core wire connected to the tuner module substrate incorporated in the case body, and at least a portion of the circuit board is contained inside the case body, wherein the tuner module substrate has an edge at which an engaged part engaged with the case body is formed, the case body is formed in a frame having a base surface part and a side part is formed at an edge part of the base surface part, and the side part includes an engaging part formed to have a first height from the base surface part, the engaging part in which the engaged part of the tuner module substrate is engaged, and a supporting part formed to have a second height greater higher than the first height from the base surface part and supporting the part of the circuit board.

8. The receiving device according to claim 7, wherein the case body includes a connector fixing part formed to have a third height greater than the second height from the base surface part and to which the antenna connector is fixed so that the core wire faces inside the case body.

9. The receiving device according to claim 8, wherein the antenna connector has an outer diameter having a height equal to the third height of the connector fixing part, and with the engaged part of the tuner module substrate being engaged in the engaging part and the circuit board being supported by the supporting part, the tuner module substrate and the part of the circuit board are contained inside the case body within a height shorter than the outer diameter of the antenna connector.

10. The receiving device according to claim 8, wherein at least one of the tuner module substrate and the circuit board facing the connector fixing part is notched so as to avoid the connector fixing part of the antenna connector.

11. The receiving device according to claim 7, wherein the core wire of the antenna connector has an arc shape avoiding interference with the tuner module substrate to which the core wire is connected.

12. The receiving device according to claim 7, wherein the circuit board has a function of the tuner module substrate, and is disposed at an engaging position for the tuner module substrate.

* * * * *